United States Patent [19]

Hasegawa et al.

[11] Patent Number: 5,246,528
[45] Date of Patent: Sep. 21, 1993

[54] AUTOMATIC WAFER ETCHING METHOD AND APPARATUS

[75] Inventors: Fumihiko Hasegawa, Saitama; Shinji Sato, Fukushima, both of Japan

[73] Assignee: Shin-Etsu Handotai Co., Ltd., Tokyo, Japan

[21] Appl. No.: 890,195

[22] Filed: May 29, 1992

[30] Foreign Application Priority Data

May 31, 1991 [JP] Japan .................................. 3-156090
May 31, 1991 [JP] Japan .................................. 3-156091

[51] Int. Cl.⁵ ...................... H01L 21/306; B44C 1/22
[52] U.S. Cl. .................................... 156/639; 156/645; 156/662; 156/345
[58] Field of Search ............... 156/639, 645, 657, 662, 156/345; 134/3, 26, 27, 28, 34, 36, 61; 437/225, 226

[56] References Cited

U.S. PATENT DOCUMENTS 4,976,815 12/1990 Hiratsuka et al. .................. 156/345

*Primary Examiner*—William A. Powell
*Attorney, Agent, or Firm*—Lowe, Price, LeBlanc & Becker

[57] ABSTRACT

An automatic wafer etching apparatus including a first elevator and a second elevator each having a top surface whose vertical cross-section is circularly concaved having a curvature equal to that of the wafers and adapted to reciprocate vertically such that the top surface can pass through the etching drum, and an etching drum having a main housing consisting of a pair of vertical parallel side plates opposing each other, a horizontal shaft integral with the main housing side plates; a plurality of rollers borne between the main housing side plates in a manner such that they are freely rotatory; the rollers having annular grooves in their surfaces to receive edges of wafers in a manner such that the wafers are supported vertically at suitable intervals in a horizontal row; small-diameter gears locked at those ends of the rollers.

7 Claims, 15 Drawing Sheets

AUTOMATIC WAFER ETCHING METHOD AND APPARATUS

BACKGROUND OF THE INVENTION

The present invention relates to an automatic wafer etching method and an apparatus therefor, adopted in the field of semiconductor wafer manufacturing, and in particular the invention concerns such a method and an apparatus wherein a plurality of wafers contained in a basket are automatically transferred to another container all at a time to thereby attain completely automatic etching operation.

DESCRIPTION OF THE PRIOR ART

A semiconductor wafer to be made into substrates for semiconductor electronic devices is produced in the following manner: a single crystal ingot of a semiconductor material such as silicon is sliced into thin plates by cutting it in a direction substantially normal to the axis of the ingot; then, the faces of the plates are lapped, etched, annealed and polished and eventually the plates are rendered thin round disks having a mirror face on one side of them.

After the lapping, the wafers are contained in a wafer basket which carries them to a location where etching is conducted, and there the wafers are transferred from the basket to an etching drum, and the etching drum together with the wafers is submerged into an etchant so that the surfaces of the wafers are wetted and etched by the etchant, whereby the surface irregularities and the lapping abrasive powder rubbed into the surfaces of the wafers, which is caused during the surface lapping, are removed.

Although the etching operation itself is conducted automatically, the transfer operation of the wafers from the lapping location to the etching location, and that from the etching location to the annealing and polishing locations were not automatic, nor were they conducted in an in-line manner.

PROBLEMS THE INVENTION SEEKS TO SOLVE

Since the transportion of wafers from one location to another, or from one container to another was not automatic, the overall etching operation required much time and a constant attention of a human operator. Also, when the wafers were brought to a container by a transfer means, the transfer means by itself inserts the wafers into the wafer racks of the container and lets the wafers fall onto the racks so that the wafers are liable to chip as their edges collide with the frames of the wafer racks.

Thus, it has been desired that the series of operations in the etching apparatus are all conducted automatically on end, and that in a manner such that the wafers are not allowed to hit upon any part of the containers. To realize this it was necessary to automatize the wafer transportion operations, and the wafers ought to be transferred from one container to another by a means more sophisticatedly designed than the conventional transfer means is. For example, when a basketful of wafers already polished and housed in the wafer basket are to be automatically etched at the etching location, the wafers in the basket must be automatically transported into the etching drum of the etching machine, and this must be conducted harmlessly.

The present invention was made in view of these problems, and it is, therefore, an object of the invention to provide an automatic wafer etching method and an apparatus therefor wherein a basketful of wafers are automatically conveyed from one location (container) to another all at once and without letting the wafers hit upon the frames of the wafer receiving bodies.

MEANS TO SOLVE THE PROBLEMS

In order to attain the object of the invention, there is provided an automatic wafer etching apparatus, having a plurality of tanks of which one contains an etchant and others pure water, a first wafer container for containing a number of wafers to steep them in pure water contained in said pure water tanks, a second wafer container for containing as many wafers as said first wafer container to steep the wafers in the etchant in said etchant tank, said automatic wafer etching apparatus being characterized by further including an automatic wafer transfer mechanism for transferring said wafers from said first wafer container to said second wafer container, and vice versa, within pure water.

In a preferred embodiment of the invention, the automatic wafer transfer mechanism comprises: a first elevator means having a concave curved top surface of a curvature equal to that of the wafers and adapted to reciprocate vertically such that said top surface can pass through a wafer container; a second elevator means having a concave curved top surface of a curvature equal to that of the wafers and adapted to reciprocate vertically such that said top surface can pass through a wafer container; and a transfer means for picking up the wafers from the top surface of said first elevator means as the wafers are raised in the wafer container to a predetermined height by elevation of said first elevator means and transferring and placing the wafers onto the top surface of said second elevator means when this elevator means has risen to a predetermined height.

In another preferred embodiment of the invention, the automatic wafer transfer mechanism comprises: a means for transferring said first wafer container; a means for holding stationary either one of said first wafer container or said second wafer container; a means for bringing either one of said first wafer container or said second wafer container that is not held stationary to the other wafer container in a manner such that the opening of one container enters the opening of the other container; and a means for chucking and rotating either one of said first wafer container or said second wafer container that is held stationary by said holder means.

Preferably, said first wafer container is a wafer basket, and said second wafer container is an etching drum which drum comprises: a main housing consisting of a pair of vertical parallel side plates opposing each other; a horizontal shaft means integral with said main housing side plates; a plurality of rollers borne between said main housing side plates in a manner such that they are freely rotatory; said rollers having annular grooves in their surfaces to receive edges of wafers in a manner such that the wafers are supported vertically at suitable intervals in a horizontal row; small-diameter gears locked at those ends of said rollers which extend beyond one of the main housing side plates; a movable housing having a pair of vertical parallel side plates opposing each other and borne by said rotary shaft in a manner such that said movable housing can rotate freely about this shaft; a set bar borne between said side plates of the movable housing in a manner such that said set bar is freely rotatory about its center line; a small-diameter gear locked about that end of said set bar which extends beyond said movable housing; and a large-diameter gear which is borne about said rotary shaft and meshes with said small-diameter gears.

According to the inventions there is also provided a method for automatically etching a plurality of wafers at a time, adopted in an automatic wafer etching apparatus having a plurality of tanks of which one contains an etchant and others pure water, a first wafer container for containing a number of wafers to steep them in pure water contained in said pure water tanks, a second wafer container for containing as many wafers as said first wafer container to steep the wafers in the etchant in said etchant tank, this method comprising the steps of: automatically transferring said wafers from said first wafer container to said second wafer container within pure water contained in one of said pure water tanks, having said second wafer container steeped in the etchant contained in said etchant tank, and transferring said wafer from said second wafer container to said first wafer container within pure water contained in one of said pure water tanks.

According to a preferred embodiment, a method is proposed which comprises the steps of: causing said wafer basket containing wafers to approach said wafer drum in a manner such that the opening of said wafer basket enters the opening of the wafer drum; turning said wafer drum together with said wafer basket to thereby cause the wafers to roll into said wafer drum.

EFFECTS

According to the invention, the wafers are automatically transferred from one wafer container to another wafer container without colliding with any part of the containers.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

These and other objects and many of the attendant advantages of this invention will be readily appreciated as the same becomes better understood by reference to the following detailed description when considered in connection with the accompanying drawings.

FIG. 13 is a schematic drawing showing how the wafer transfer operation is carried on;

FIG. 14 is a schematic drawing showing how the wafer transfer operation is carried on;

FIG. 15 is a schematic drawing showing how the wafer transfer operation is carried on;

FIG. 16 is a schematic drawing showing how the wafer transfer operation is carried on;

FIG. 17 is a schematic drawing showing how the wafer transfer operation is carried on;

FIG. 18 is a schematic drawing showing how the wafer transfer operation is carried on;

FIG. 19 is a schematic drawing showing how the wafer transfer operation is carried on; and FIG. 20 is a schematic drawing showing how the wafer transfer operation is carried on.

EMBODIMENTS

Next, embodiments of the invention will be described with reference to the attached drawings.

A First Embodiment

Figure 1:
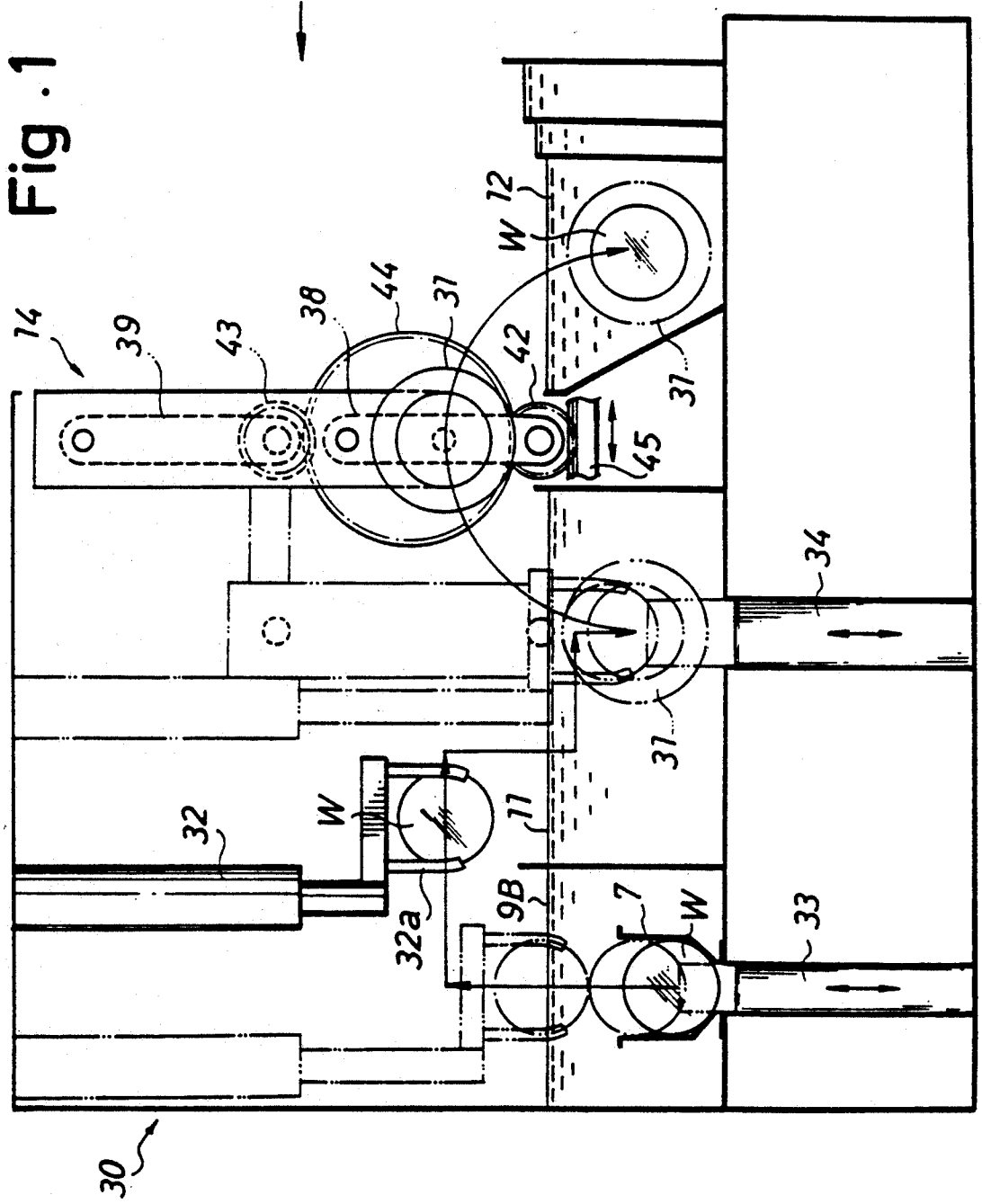
FIG. 1 is a side view of an automatic etching apparatus having a wafer transfer mechanism of the invention.
Figure 3:
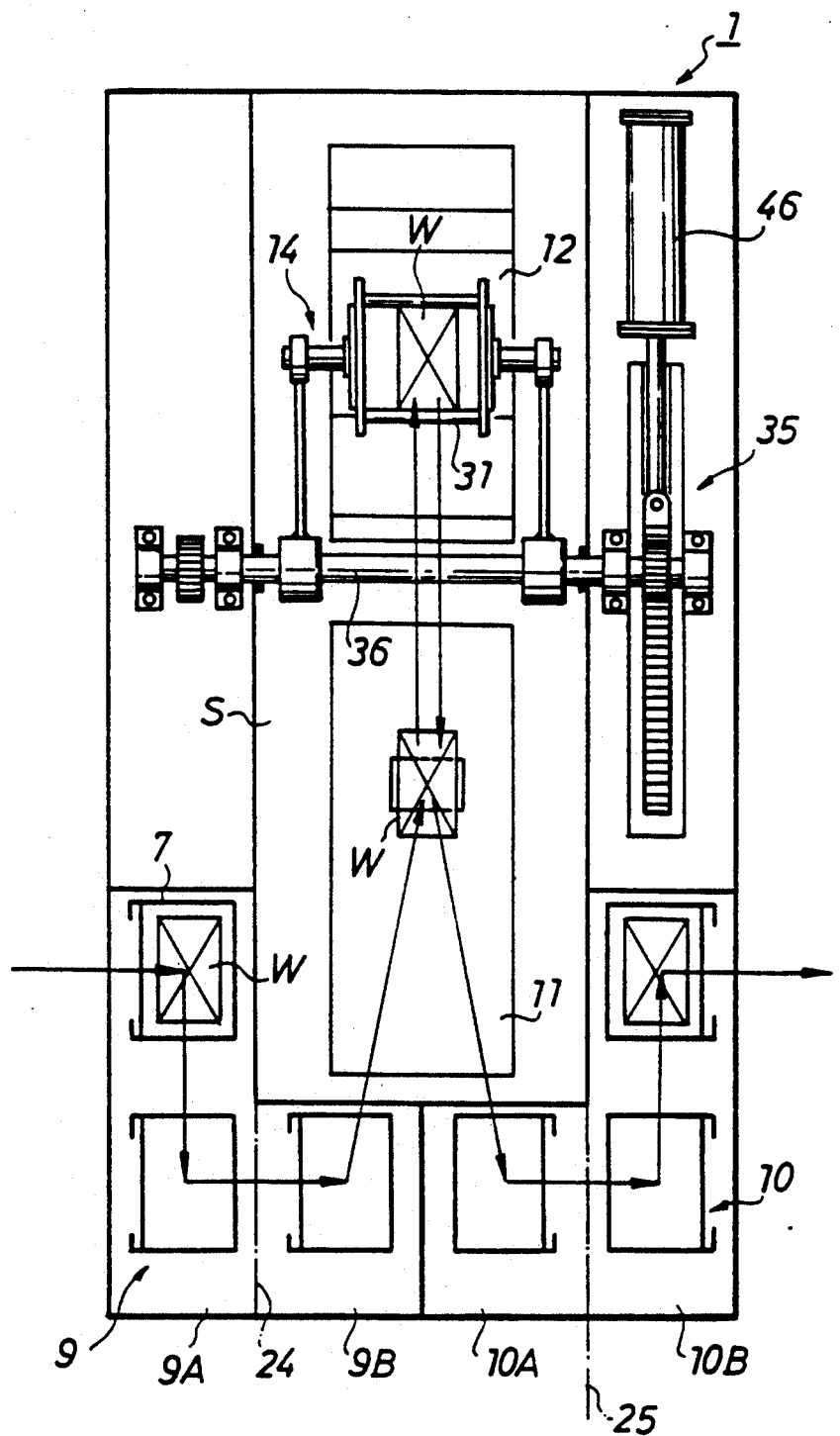
FIG. 3 is a top plan view of the same apparatus of FIG. 1.

FIG. 1 is a side view of an automatic etching apparatus 1 having a wafer transfer assembly 30. As shown in FIG. 3, which is a top plan view of the automatic etching apparatus 1, the apparatus 1 comprises: two water tanks 9, 10, which have a shape resembling the letter "L" when seen from above, a rinse tank 11, an etching tank 12, a wafer transfer assembly 30, 33, 34 (FIG. 1), and an etching machine 14. Incidentally, the water tanks 9, 10 and the rinse tank 11 contain pure water, and the etching tank 12 contains a mixed acid as the etchant.

Vertical partition walls 24, 25 are provided to separate the water tanks 9, 10 of the automatic etching apparatus 1, respectively, in a manner such that the upper portions of the walls 24, 25 completely disconnect and separate the space above the water level into two spaces, and the lower ends of the walls 24, 25 separate the water only partially and define a passage space with the bottom of the tanks 9, 10. Thus, the partition wall 24 divides the water tank 9 into an entrance division 9A and a transfer division 9B, which are in communication with each other in the bottom, and similarly, the partition wall 25 divides the water tank 10 into a transfer division 10A and an exit division 10B, which are also in communication with each other in the bottom. Incidentally, the transfer divisions 9B, 10A and the rinse tank 11 and the etching tank 12 are all within a closed space (etching draft) S, as shown in FIG. 3, and as such, the harmful gas generated by etching operation does not escape the closed space.

Next, the constructions of the wafer transfer mechanism and the etching machine 14 will be described.

The wafer transfer mechanism 30, 33, 34 is designed to automatically and safely transfer a batch of wafers W contained in a wafer basket 7 all at once into a wafer etching drum 31 supported by the etching machine 14, and comprises a wafer arm 32 as the wafer transfer means, a pair of wafer forks 33, 33 as the wafer elevator means, and a wafer fork 34 as a third wafer elevator means.

The wafer arm 32 has a hand 32a at its lower end for grasping the number of wafers W all at once, and since the arm 32 is adapted to undergo a lateral motion and the hand 32a is adapted to slide vertically, the hand 32a can shift to an arbitrary position in and around the etching apparatus 1. Also, as shown in FIG. 1, the wafer forks 33, 33 and 34 are provided underneath the tank divisions 9B, 10A and the rinse tank 11, respectively, and are adapted to slide vertically by means of drive mechanisms, not shown. Thus, the wafer forks 33, 33 and 34 jut out and cave in the bottoms of the tank divisions 9B, 10A and the rinse tank 11.

Figure 2:
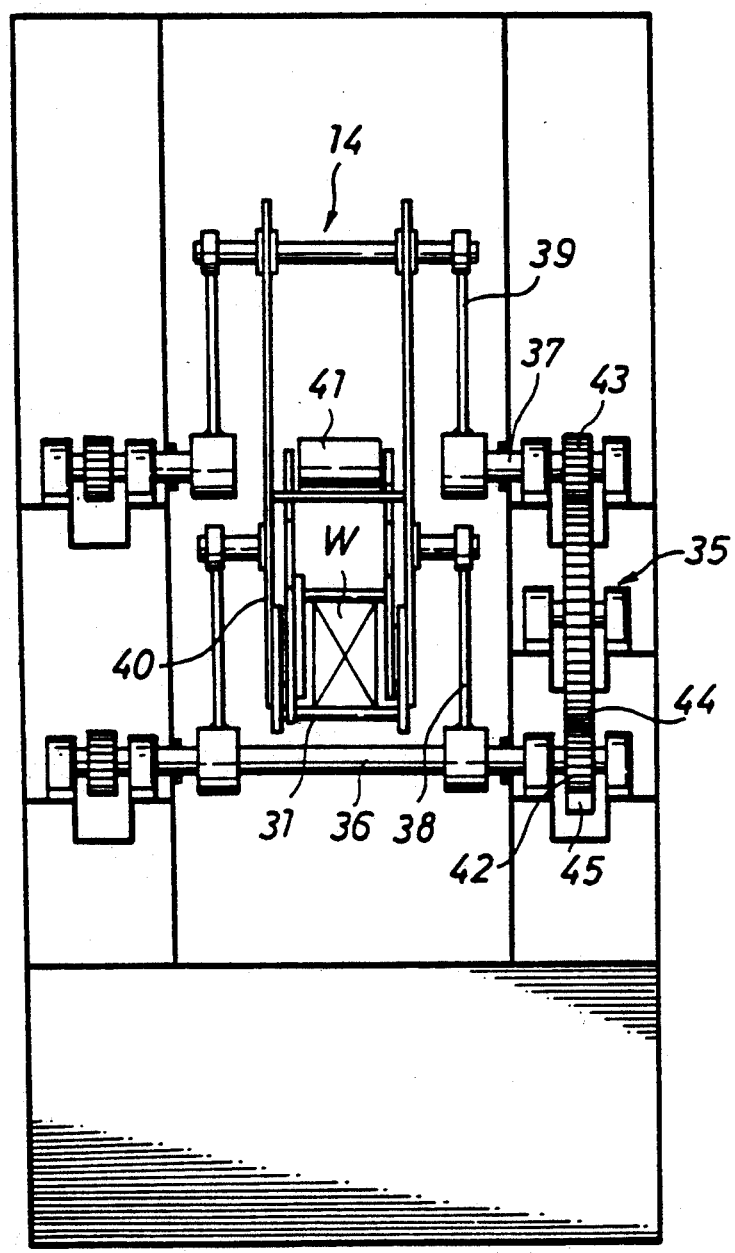
FIG. 2 is a view of the same apparatus of FIG. 1, as seen in the direction of arrow X.

The etching machine 14 is adapted to shift the etching drum 31, which receives the wafers W in consequence of the operation of the wafer transfer mechanism, in a parallel motion to and fro between the rinse tank 11 and the etching tank 12, and the machine 14 is driven by a transfer unit 35. As shown in FIGS. 2 and 3, rotary shafts 36, 37, freely rotatory, are horizontally borne and are adapted to travel (translate) between the rinse tank 11 and the etching tank 12, the shaft 37 consisting of two portions and being above the shaft 36. A pair of arms 38 are attached fixedly to the rotary shaft 36, and a pair of arms 39 are fixedly attached to the rotary shaft 37, one arm to one portion. A drum holder 40, which constitutes a frame construction, is pivotally supported at the ends of the arms 38, 39, and the drum 31 is detachably received in this drum holder 40. A motor 41 is mounted on the drum holder 40, and is adapted to cause the drum 31 to engage and disengage with the drum holder 40 and also to cause the drum 31 to rotate.

The right ends of the rotary shafts 36 and 37, as viewed in FIG. 2, are provided with small-sized gears 42 and 43, respectively, and these gears 42, 43 mesh with a large-sized idler gear 44, which is between these smaller gears. The gear (pinion) 42 is also meshed with a rack 45, which 45 is adapted to undergo a reciprocating longitudinal motion in the direction shown by the two-pointed arrow in FIG. 1, by means of an air cylinder 46 of the etching machine 14. This direction is vertical to the plane of the sheet of FIG. 2.

Figure 6:
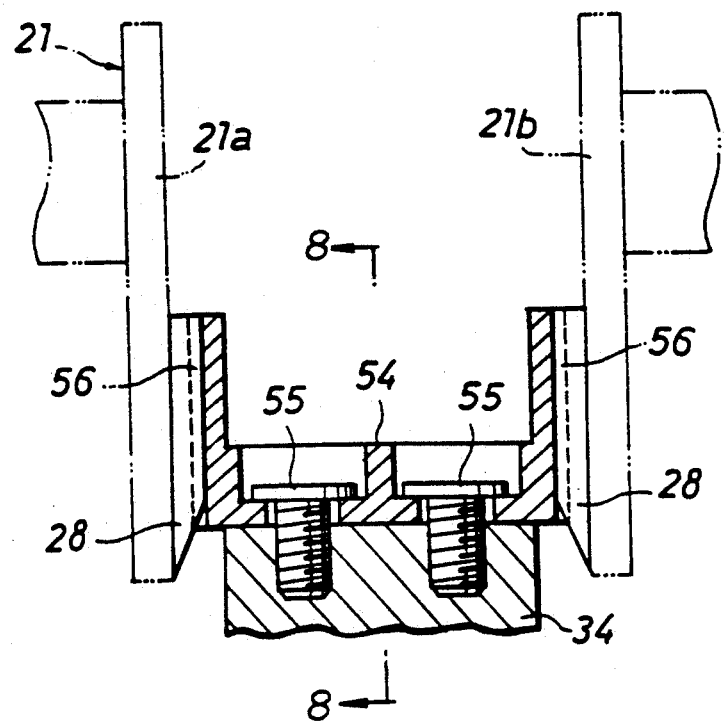
FIG. 6 is a cross-sectional view showing how a wafer fork engages with the drum.
Figure 7:
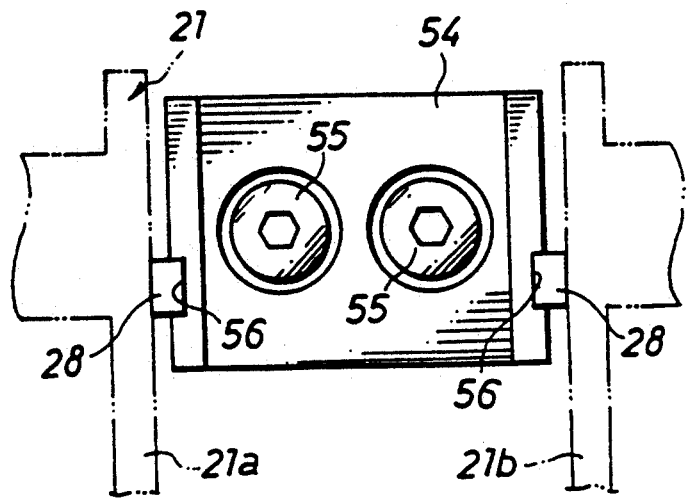
FIG. 7 is a top plan view showing how the wafer fork engages with the drum.
Figure 8:
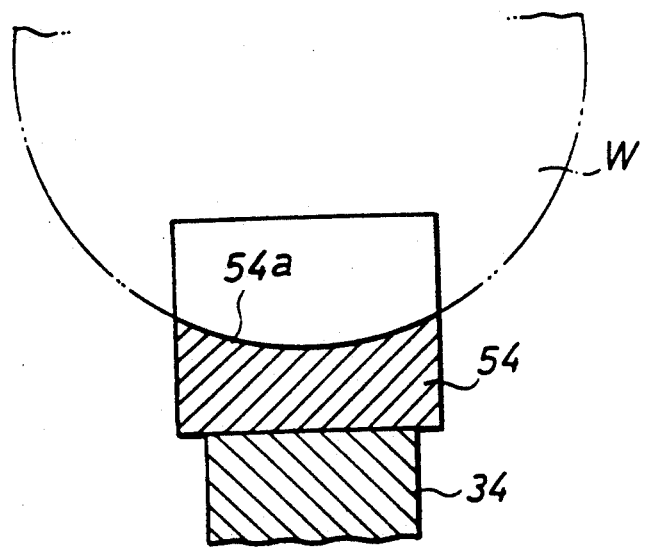
FIG. 8 is a cross-sectional view of the wafer fork, taken along section lines C—C of FIG. 6.

Next, the construction of the drum 31 and the wafer fork 34 will be described with reference to FIGS. 4 through 8. Incidentally, FIG. 4 is a side view of the drum 31, as seen in the direction of arrows A, A in FIG. 5, and FIG. 5 itself is a cross-sectional view taken along section lines B—B of FIG. 4, and FIG. 6 is a cross-sectional view showing how the drum 31 when opened engages with the wafer fork 34, and FIG. 7 is a top plan view of the same, and FIG. 8 is a cross-sectional view taken along section lines C—C of FIG. 6.

Figure 4:
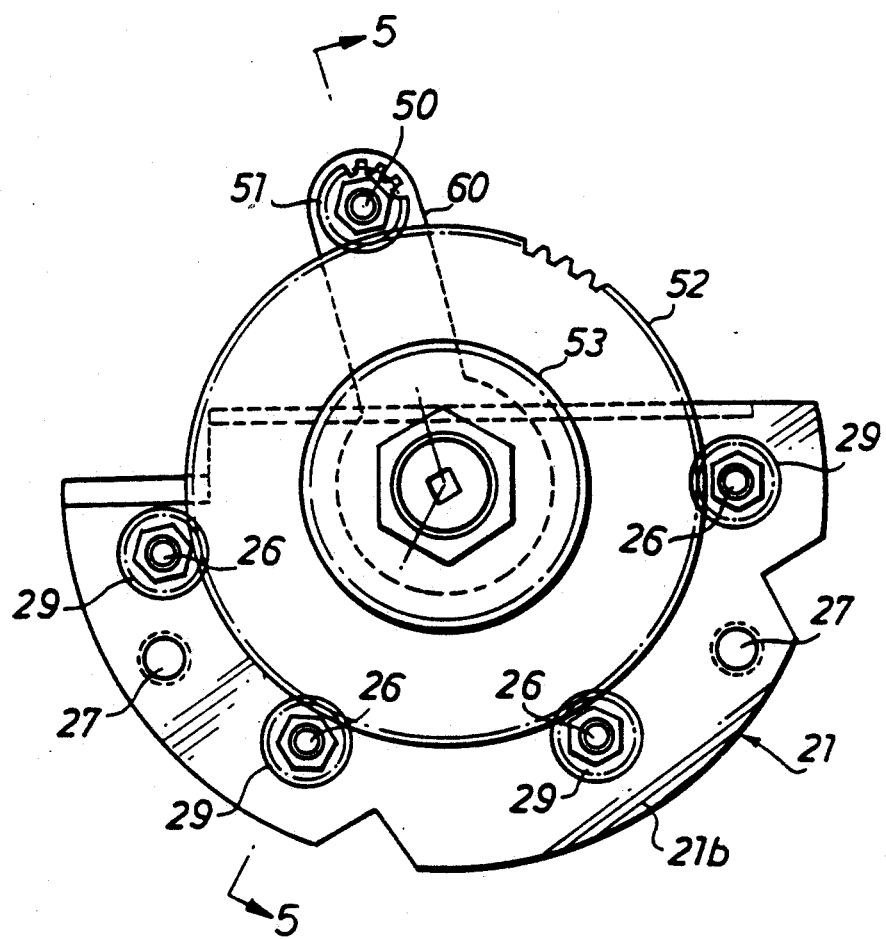
FIG. 4 is a side view of a wafer drum, as seen in the direction of arrows A, A in FIG. 5.
Figure 5:
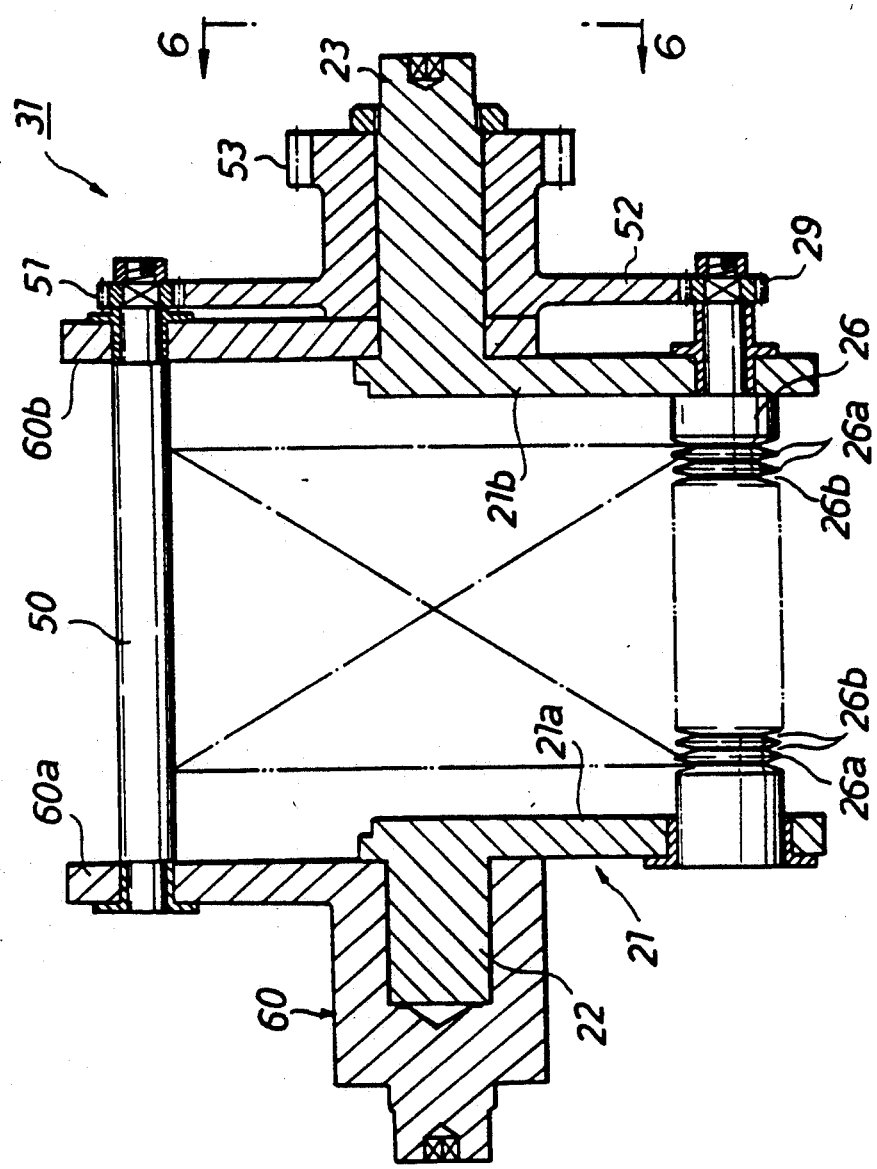
FIG. 5 is a cross-sectional view of the same drum, taken along section lines B—B of FIG. 4.

In FIGS. 4 and 5, the reference numeral 21 designates a housing consisting of a pair of generally semicircular side plates 21a and 21b, which face parallel to each other, and horizontal, collinear rotary shafts 22 and 23 are integrally attached to the respective side plates 21a, 21b. Four horizontal rollers 26, freely rotatory, are supported by and between the side plates 21a, 21b of the housing 21 in a manner such that their center lines define a hypothetical circular cylinder whose center line is identical with the center line of the shafts 22, 23. The side plates 21a, 21b are reinforced by means of two horizontal reinforce bars 27, which rigidly connect the plates together. On the inner surface of each side plate 21a, 21b of the housing 21 is formed a straight guide ridge 28, which extends vertically (ref. FIG. 6 and FIG. 7).

The surface of each roller 26 is formed with numerous annularly cut grooves 26b and thus with numerous annular teeth 26a, except at the end portions of the roller 26 (ref. FIG. 5 where only one of the rollers 26 is shown). The teeth 26a and the grooves 26b are of such dimension appropriate to receive the edges of the wafers W in the grooves 26b and support the wafers W vertically at suitable intervals in a horizontal row. That end of each roller 26 which is supported by the side plate 21b, penetrates and protrudes from the side plate 21b, and is provided with a small-sized gear 29.

A movable housing 60 is supported on the rotary shafts 22 and 23 in a manner such that the housing 60 can turn freely about the shafts 22 and 23. The housing 60 includes a pair of side plates 60a and 60b, which hold between themselves a horizontal set bar 50 in a manner such that the bar 50 can freely turn about its center line. That end of the bar 50 which is supported by the side plate 60b of the movable housing 60, penetrates and protrudes from the side plate 60b, and is provided with a small-sized gear 51 identical with the gear 29.

About the rotary shaft 23 is supported a rotary body which is integral with a large-diameter gear 52 and a small-diameter gear 53, this rotary body being freely rotatory about the shaft 23, and the large-diameter gear (center gear) 52 meshing with all of the gears 29 and the gear 51, as shown in FIG. 4.

As shown in FIG. 6 and FIG. 7, a holder (wafer pusher) 54 is fixed onto the top face of the wafer fork 34 by means of screws 55, 55, and outer faces of the side plates of the holder 54 are formed with vertical guide grooves 56, 56, which engage slidably with the guide ridges 28, 28. As shown in FIG. 8, the holder 54 is formed with a concave curved surface 54a, which has a curvature equal to that of the wafers W so that the edges of the wafers W fit on the surface 54a. Also, the other wafer forks 33, 33 are each provided with a holder similar to the holder 54.

Next, the operation of this automatic etching apparatus 1 according to the first embodiment of the invention shall be described.

The wafers W which have been lapped in the foregoing stage, are placed in the wafer basket 7, and are cleaned before being etched by means of a prior-to-etching cleaning apparatus, not shown, without being removed from the basket 7. After the cleaning, the wafers W are steeped in the entrance division 9A of the water tank 9 of the automatic etching apparatus 1.

The entrance division 9A and the transfer division 9B of the water tank 9 are divided from each other by the partition wall 24 except at the bottom, where there is a communication passage. The wafers W housed in the basket 7 are moved through the pure water from one end to the other of the tank division 9A, and then the basket 7 containing the wafers W is passed underneath the partition wall 24 and enters the transfer division 9B. Thus, the wafers W are brought into the closed space (etching draft) S, and the surfaces of the wafers W will be etched inside this closed space S.

Next, the wafers W in the transfer division 9B are transferred from the basket 7 to the drum 31, which suberged in the pure water in the rinse tank 11 is waiting for the wafers, by means of the wafer transfer mechanism of the present invention in the following manner.

As shown in FIG. 1, when the basket 7 is set over the wafer fork 33 in the bottom of the transfer division 9B, the wafer fork 33 is caused to rise up, as shown in the broken line, and supports and pushes up the wafers W, while the basket 7 remains where it is, until the wafers W ascend to a predetermined height where the hand 32a of the wafer arm 32 can pick up the wafers W. Then, the hand 32a of the wafer arm 32, which is held above the wafers W waiting for the wafers W to rise sufficiently, slides down and picks up all of the wafers W, and transfers the wafers W along the course indicated by the line consisting of consecutive arrows in FIG. 1. As the result, the wafers W are brought above the drum 31, which 31 is in wait for the wafers W in the pure water filling the rinse tank 11.

At this juncture, the drum 31 is above the wafer fork 34, and is assuming the open state; then, the wafers W brought above the drum 31 by means of the wafer transfer assembly 30 are lowered into the drum 31 as the hand 32a of the wafer arm 32 slides down. But before the wafers W are lowered into the drum 31, the wafer fork 34 has been raised and is waiting for the wafers W, as shown in broken line in FIG. 1. In other words, the wafer fork 34 has been caused to slide up by a drive means, not shown, and the holder 54 of the wafer fork 34 has entered in the drum 31. As the holder 54 enters in the drum 31, the guide ridges 28, 28 of the drum 31 engage with the guide grooves 56, 56 formed in the holder 54, as shown in FIGS. 6 and 7, so that the rising movement of the wafer fork 34 is guided to be vertical. Incidentally, the open state of the drum 31 is such that the movable housing 60 is lying horizontally on the housing 21 so that the drum 31 opens upwardly, and through this opening the wafers W are brought in or out of the drum 31.

Thus, before the wafers W are completely housed by the drum 31, they are firstly supported by the curved surface 54a of the holder 54 of the wafer fork 34. Then, the wafer fork 34 is caused to descend slowly together with the wafers W, guided by the guide ridges 28, 28 of the drum 31, and as the result, the wafers W softly alight and fit in the grooves 26b formed in the surface of each roller 26 without a collision and the etching drum 31 entirely houses the wafers W. Thereafter, when the movable housing 60 is turned up to a position shown in FIG. 4, the drum 31 assumes the closed state, whereby the wafers W housed in the drum 31 are prevented by the set bar 50 from dropping, and thus the transfer operation of the wafers W from the basket 7 to the drum 31 is completed.

Next, when the rack 45 is longitudinally shifted by means of the air cylinder 46 of the etching machine 14, the gear (pinion) 42 meshed with the rack 45 turns, and this rotary motion is conveyed to the gear 43 by means of the idler gear 44, and as the result, the shafts 36 and 37 are caused to turn at the same time, at the same rate, in the same direction. This means that the arms 38 and 39, respectively locked about the shafts 36 and 37, swing simultaneously in the same direction so that the drum holder 40 supported by these arms 38, 39 and the drum 31 held by the drum holder 40 undergo a parallel motion from the rinse tank 11 to the etching tank 12, and as the result, the wafers W held in the drum 31 are passed from the pure water of the rinse tank 11 into the mixed acid (etchant) of the etching tank 13.

The wafer etching drum 31, now soaked in the mixed acid of the etching tank 12, is turned round by means of the motor 41 (ref. FIG. 2), whereby the wafers housed in the wafer etching drum 31 turn together with the drum 31 and thus the etching of the wafer surface is facilitated, and the surface irregularities and the lapping abrasive powder rubbed into the wafer surface, which are caused during the surface lapping are removed. Incidentally, although it is not shown in the drawings, a bubbling apparatus is installed in the etching tank 12, and from this bubbling apparatus are blown clean air bubbles toward the drum 31, so that the mixed acid is stirred by the bubbles, and as the result, the temperature distribution of the mixed acid in the etching tank 12 becomes uniform and the wafer surface is etched evenly, and at the same time, the mixed acid is prevented from promptly degrading. The nitrogen oxides generated in the course of the etching operation are exhausted from the closed space (etching draft) S by means of a suction device, not shown.

When the etching operation of the wafers W is completed as described above, the air cylinder 46 is again driven so that the drum 31 is raised out of the mixed acid of the etching tank 12, and again steeped in the pure water of the rinse tank 11. Thereafter, the wafers W housed in the drum 31 are transferred from the drum 31 to the basket 7, which is in the transfer division 10A of the water tank 10 in wait for the wafers, by means of the wafer carrier 30 as well as the wafer forks 34 and 33, which operate in the similar manner as described above.

The wafers W which have been transferred into the basket 7 are carried by the basket 7 through the pure water of the tank division 10A along the course indicated by the line consisting of consecutive arrows in FIG. 3, and then the basket 7 containing the wafers W is passed underneath the partition wall 25 and enters the exit division 10B. Thus, the wafers W are removed from the closed space (etching draft) S, and thereafter, the wafers W are cleaned by means of a prior-to-anneal cleaning apparatus, not shown.

As described above, this embodiment of the invention enables automatic transfer of the wafers W from the basket 7 to the drum 31, and the other way round, so that the entire wafer production line becomes more automatized.

Next, a second embodiment of the invention will be described with reference to the attached drawings.

A Second Embodiment

Figure 9:
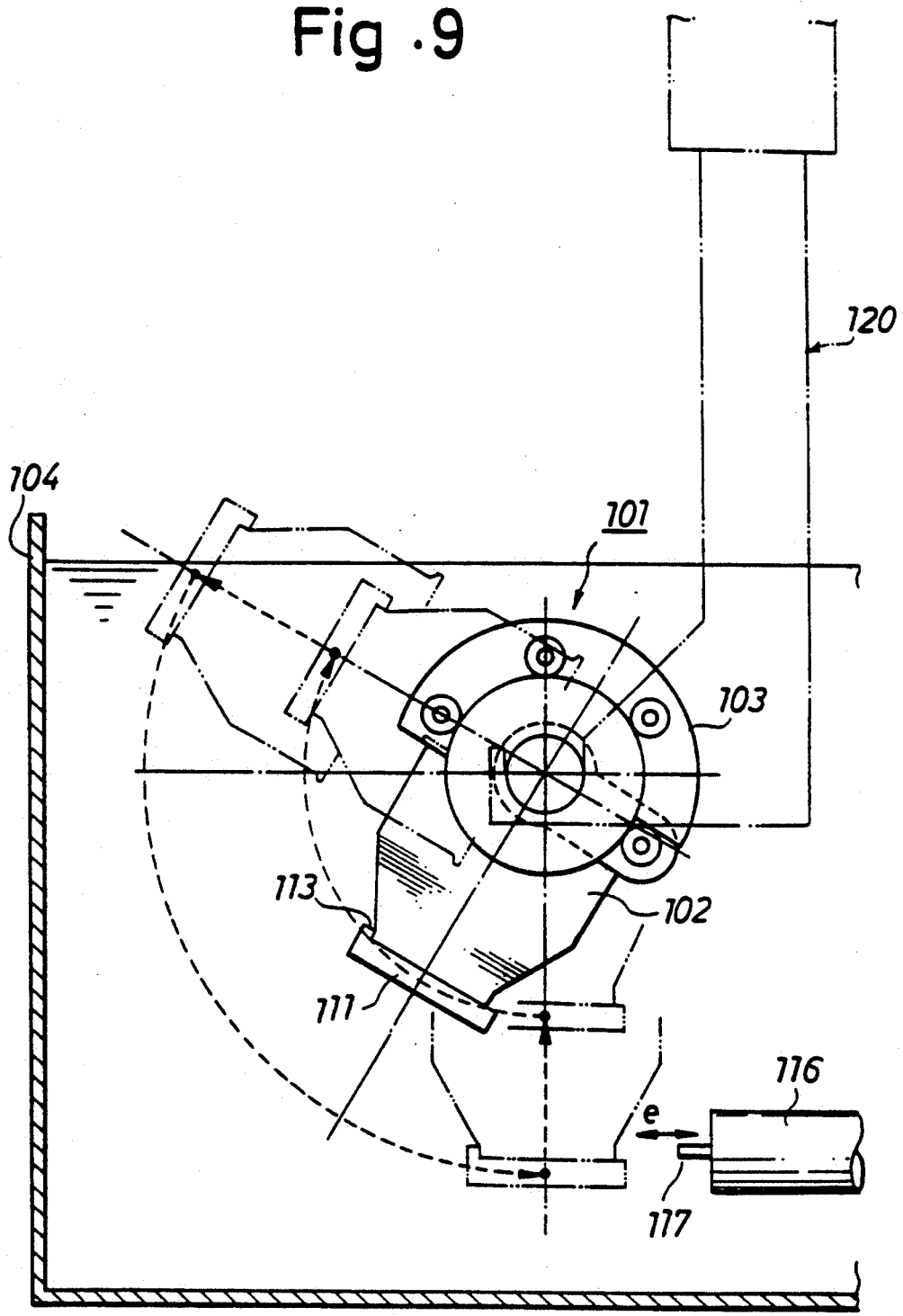
FIG. 9 is a side view of a wafer transfer assembly according to the invention.
Figure 10:
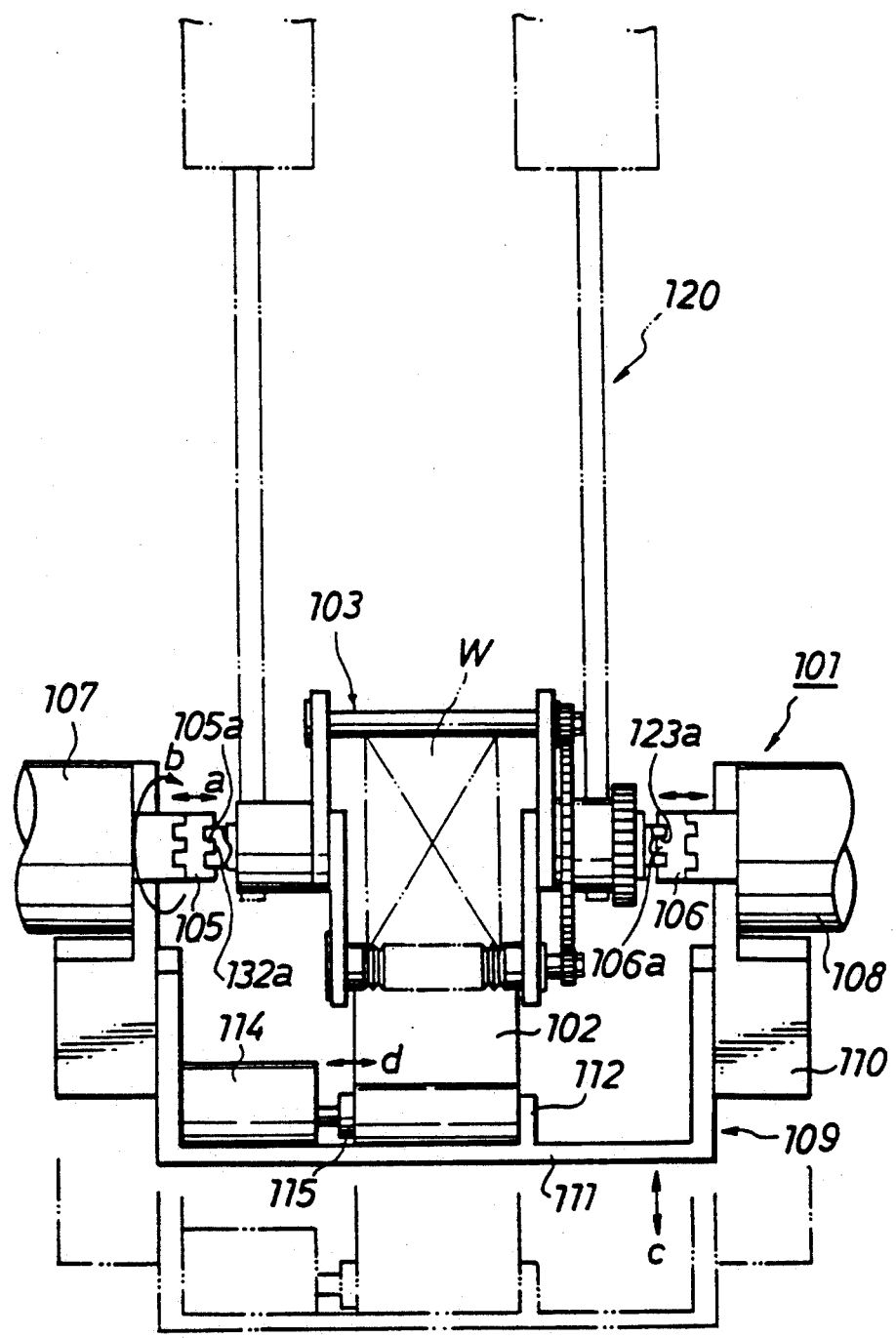
FIG. 10 is a front view of the wafer transfer assembly of FIG. 9.

FIG. 9 is a side view of an automatic etching apparatus having a wafer transfer assembly 101 of the second embodiment of the invention; FIG. 10 is a front view of the same assembly 101.

The wafer transfer assembly 101 of this embodiment is adapted to automatically transfer a plurality of lapped wafers W contained in a wafer basket 102 to a wafer etching drum 103 of an etching machine all at once, and this assembly 101 is submerged in the pure water contained in a transfer tank 104.

In FIG. 10, the reference numerals 105 and 106 designate a pair of coaxial drum chucks whose heads are opposed to each other; driven by drive means 107 and 108, respectively, these drum chucks 105, 106 are adapted to reciprocate axially as indicated by horizontal double-pointed arrows, and also turn about their axes. A basket set assembly 109 is connected to the drum chucks 105, 106 in a manner such that the basket set assembly 109 is turned with the chucks 105, 106 in one body, and a basket set mount 111 is included in the assembly 109 and is adapted to shift in a radial direction of the drum chucks 105, 106 (as indicated by the double-pointed arrow c), driven by a drive means 110. To the bottom of the basket set mount 111 are attached stoppers 112 and 113, and on the floor of the basket set mount 111 is installed a basket stopper device 114, which has a basket pusher 115 adapted to reciprocate in the direction indicated by the double-pointed arrow d so that it can hold the basket 102 between itself and the stopper 112.

In FIG. 9, the reference numeral 116 designates a basket-positioning device, and this device 116 has a rod 117 adapted to reciprocate in the direction indicated by the double-pointed arrow e, which is normal to the direction d, so that when the basket set mount 111 comes right below the drum 103, the rod 117 engages with the stopper 113 of the basket set mount 111.

Figure 11:
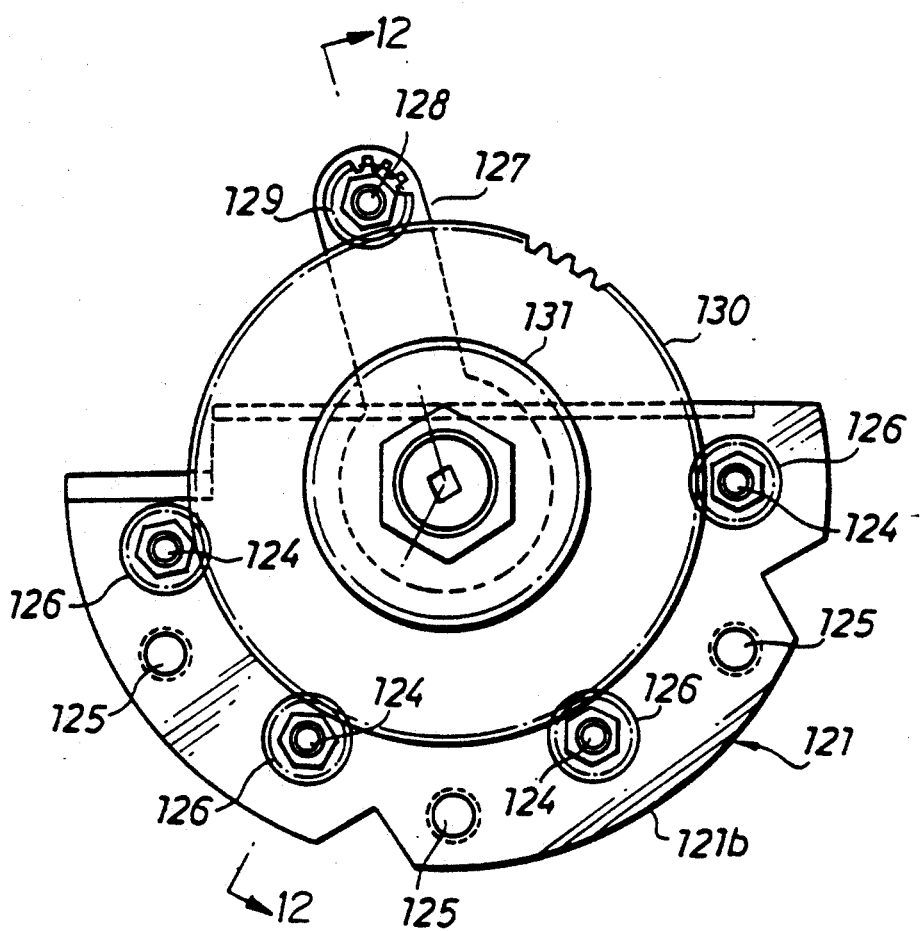
FIG. 11 is a side view of a wafer drum (seen in the direction of arrows A of FIG. 4)
Figure 12:
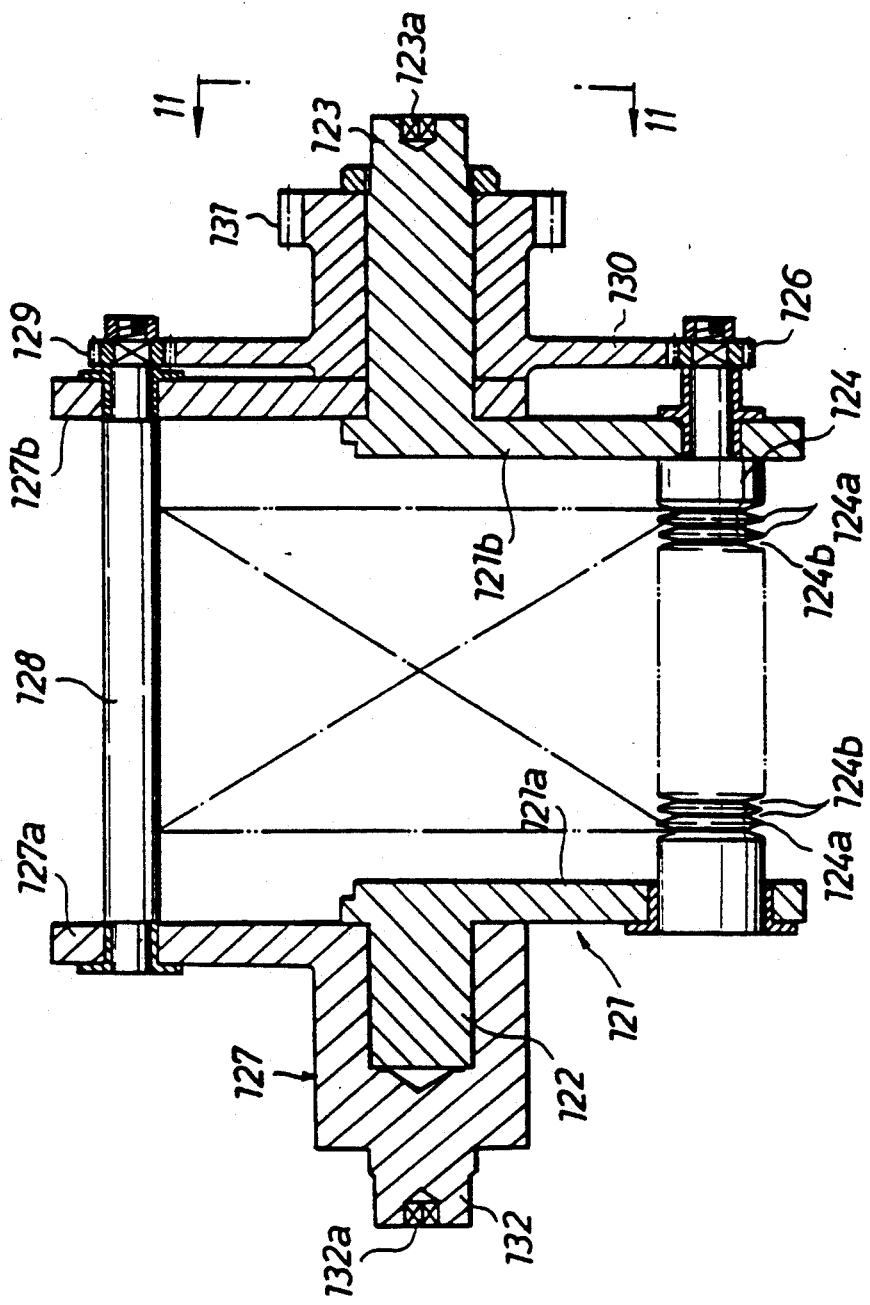
FIG. 12 is a cross-sectional view of the drum taken along the sectional lines B—B of FIG. 10.

The drum 103 is supported and transferred by means of a drum carrier robot 120, and is detachably chucked by means of the drum chucks 105, 106. Since the structure of the wafer etching drum 103 is similar to that of the wafer etching drum 31 of the first embodiment, detailed description of the elements of the drum 103 is omitted (ref. FIGS. 11 and 12 for reference numerals of elements of the drum 103).

The end face of the rotary shaft 132 of the movable housing 127 and that of the rotary shaft 123 of the housing 121 are respectively formed with generally rectangular parallelopiped recesses 132a and 123a so that the thus shaped end faces engage and interlock with the opposing end faces of the drum chucks 105, 106 which are formed with rectangular parallelopiped protrusions 105a, 106a (ref. FIG. 2).

Next, the manner of automatically transferring the wafers W from the basket 102 to the etching drum 103 will be explained with reference to FIGS. 13 through 20.

Incidentally, FIG. 13 through FIG. 20 are schematic drawings showing how the wafer transferring operation is conducted.

Figure 13:
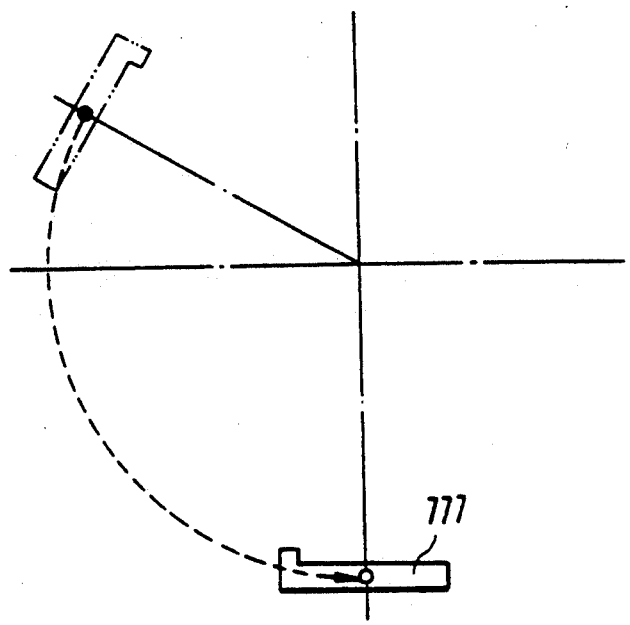

First, the drive means 107 and 108 are operated so as to turn the drum chucks 105, 106 and thereby the basket set mount 111 of the basket set assembly 109 interlocked with the drum chucks 105, 106 is turned from the position drawn in broken line to the position drawn in solid line, as shown in FIG. 13.

Figure 14:
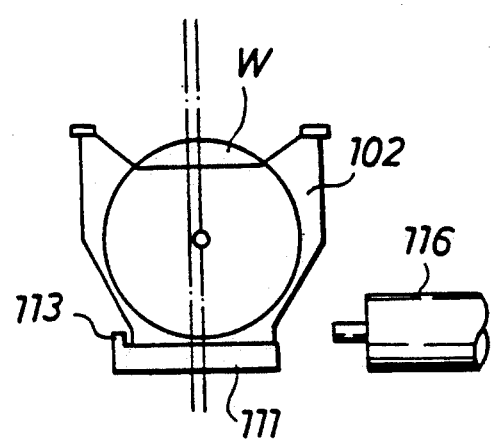
Figure 15:
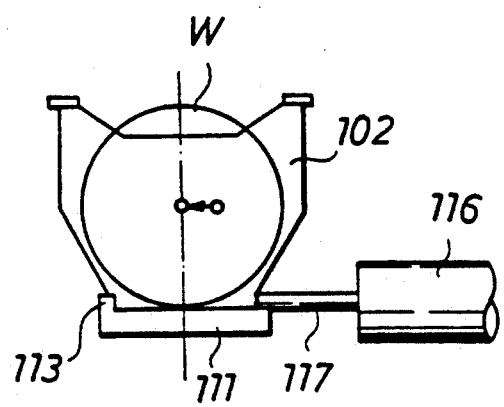
Figure 16:
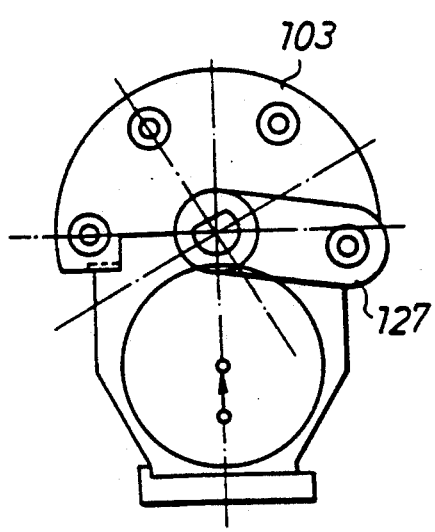

Next, the basket 102 containing a plurality (twenty, for example) of wafers W which have already been lapped and cleaned in preparation for etching in the foregoing stage, is mounted on the basket set mount 111, as shown in FIG. 14; then, as shown in FIG. 15, the basket-positioning device 116 is driven so that the rod 117 pushes the basket 102 until the basket 102 is stopped by the stopper 113, whereby the basket 102 is positioned. Thereafter, the basket stopper device 114, as shown in FIG. 10, is driven to cause the basket pusher 115 to push the basket 102 to hold it between itself 115 and the stopper 112.

Meanwhile, the empty drum 103 is removed from the etching machine, not shown, and conveyed to the wafer transfer assembly 101 by means of the drum carrier robot 120, where it is horizontally supported at its ends by the drum chucks 105, 106. In particular, when the drum 103 is duly positioned, as shown in solid line in FIG. 10, the drum chucks 105, 106, which have heretofore assumed the withdrawn positions, advance and mesh with the ends of the rotary shafts 132, 123, that is, the protrusions 105a, 106a of the drum chucks 105, 106 engage with the recesses 132a and 123a formed at the respective end faces of the rotary shafts 132, 123.

While the basket 102 is firmly fitted on the basket set mount 111, as shown in FIG. 15, the movable housing 127 of the drum 103 is turned prostrate on the housing 121 such that the drum 103 opens downwardly. At this juncture, the drive means 110 for the basket set assembly 109 is driven in a manner such that the basket set mount 111 is caused to ascend together with the basket 102 in the direction indicated by the arrow in FIG. 16, whereby the upper open portion of the basket 102 enters in the opening of the drum 103, hence a docking of the two bodies 102 and 103.

Figure 17:
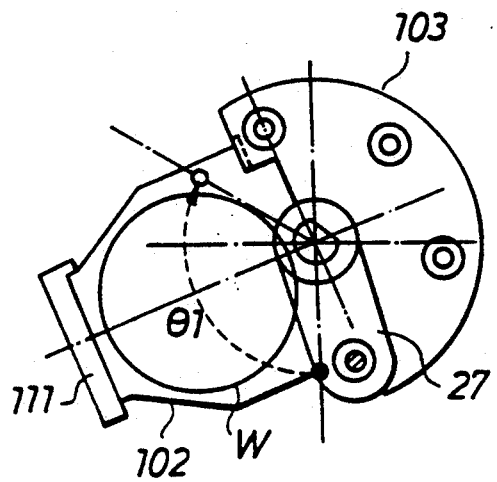

Next, the drive means 107, 108 are driven such that the drum 103 and the basket 102 are turned together through a clockwise angle $\theta_1$, as seen in FIG. 17, and as the bodies 102 and 103 turn, the wafers W in the basket 102 roll into the drum 103 due to the gravitation, and are each received in the wafer receivable grooves 124b formed of the rotary shafts in a manner such that the wafers W are vertically supported at suitable intervals in a horizontal row.

Figure 18:
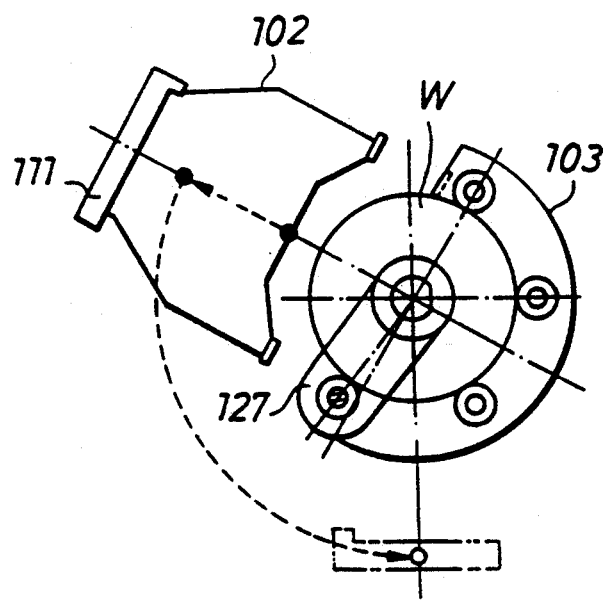
Figure 19:
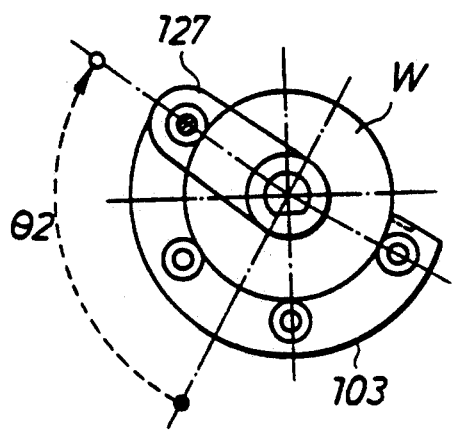
Figure 20:
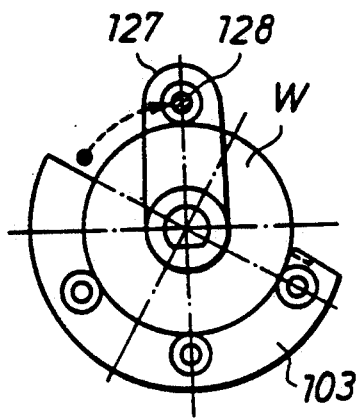

Thereafter, the basket set assembly 109 is driven again such that, as shown in FIG. 18, the empty basket 102 is removed radially from the drum 103 and then turned anticlockwise to assume the former position, as indicated in broken line; then, the drive means 107, 108 are driven again in a manner such that the drum 103 is caused to turn clockwise through an angle of $\theta_2$ to assume the position it is assuming in FIG. 19. Finally, the drive means 107 is driven to thereby cause the movable housing 127 to turn through a clockwise angle $\theta_3$ as shown in FIG. 20, and as the result, the drum 103 assumes its closed state, whereby the wafers W housed in the drum 103 are prevented by the set bar 128 from dropping, and thus the transfer operation of the wafers W from the basket 102 to the drum 103 is completed.

Now, the drum 103, in which the wafers W have been housed, is detached from the drum chucks 105, 106, and is transported to the etching machine, not shown, by means of the drum carrier robot 120.

As described above, this second embodiment of the invention also enables automatic transfer of the wafers W from the basket 102 to the drum 103, and that all at once, so that the entire wafer production line becomes more automatized.

Incidentally, in the second embodiment, the drum 103 is removed from the etching machine and transported to the transfer tank 104 by means of the drum carrier robot 120, it is alternatively effective if the basket 102 is brought to the drum 103, without removing the drum 103 from the etching machine.

While there has been described what are at present considered to be the preferred embodiments of the invention, it will be understood that various modifications may be made therein, and it is intended to cover in the appended claims all such modifications as fall within the true spirit and scope of the invention.

What is claimed is:

1. An automatic wafer etching apparatus, having a plurality of tanks of which one contains an etchant and others pure water, a first wafer container for containing a number of wafers to steep them in pure water contained in said pure water tanks, a second wafer container for containing as many wafers as said first wafer container to steep the wafers in the etchant in said etchant tank, said automatic wafer etching apparatus being characterized by further including an automatic wafer transfer mechanism for transferring said wafers from said first wafer container to said second wafer container, and vice versa, within pure water.

2. The automatic wafer transfer mechanism as claimed in claim 1 comprising: a first elevator means having a top surface whose vertical cross-section is circularly concaved having a curvature equal to that of the wafers and adapted to reciprocate vertically such that said top surface can pass through a wafer container; a second elevator means having a top surface whose vertical cross-section is circularly concaved having a curvature equal to that of the wafers and adapted to reciprocate vertically such that said top surface can pass through a wafer container; and a transfer means for picking up the wafers from the top surface of said first elevator means as the wafers are raised in the wafer container to a predetermined height by elevation of said first elevator means and transferring and placing the wafers onto the top surface of said second elevator means when this elevator means has risen to a predetermined height.

3. The automatic wafer transfer mechanism as claimed in claim 2 wherein said first wafer container is a wafer basket, and said second wafer container is an etching drum which comprises: a main housing consisting of a pair of vertical parallel side plates opposing each other; a horizontal shaft means integral with said main housing side plates; a plurality of rollers borne between said main housing side plates in a manner such that they are freely rotatory; said rollers having annular grooves in their surfaces to receive edges of wafers in a manner such that the wafers are supported vertically at suitable intervals in a horizontal row; small-diameter gears locked at those ends of said rollers which extend beyond one of the main housing side plates; a movable housing having a pair of vertical parallel side plates opposing each other and borne by said rotary shaft in a manner such that said movable housing can rotate freely about this shaft; a set bar borne between said side plates of the movable housing in a manner such that said set bar is freely rotatory about its center line; a small-diameter gear locked about that end of said set bar which extends beyond said movable housing; and a large-diameter gear which is borne about said rotary shaft and meshes with said small-diameter gears.

4. The automatic wafer transfer mechanism as claimed in claim 1 comprising: a means for transferring said first wafer container; a means for holding stationary either one of said first wafer container or second wafer container; a means for bringing either one of said first wafer container or said second wafer container that is not held stationary to the other wafer container in a manner such that the opening of one container enters the opening of the other container; and a means for chucking and rotating either one of said first wafer container or said second wafer container that is held stationary by said holder means.

5. The automatic wafer transfer mechanism as claimed in claim 4 wherein said first wafer container is a wafer basket, and said second wafer container is an etching drum which comprises: a main housing consisting of a pair of vertical parallel side plates opposing each other; a horizontal shaft means integral with said main housing side plates; a plurality of rollers borne between said main housing side plates in a manner such that they are freely rotatory; said rollers having annular grooves in their surfaces to receive edges of wafers in a manner such that the wafers are supported vertically at suitable intervals in a horizontal row; small-diameter gears locked at those ends of said rollers which extend beyond one of the main housing side plates; a movable housing having a pair of vertical parallel side plates opposing each other and borne by said rotary shaft in a manner such that said movable housing can rotate freely about this shaft; a set bar borne between said side plates of the movable housing in a manner such that said set bar is freely rotatory about its center line; a small-diameter gear locked about that end of said set bar which extends beyond said movable housing; and a large-diameter gear which is borne about said rotary shaft and meshes with said small-diameter gears.

6. A method for automatically etching a plurality of wafers at a time, adopted in an automatic wafer etching apparatus having a plurality of tanks of which one contains an etchant and others pure water, a first wafer container for containing a number of wafers to steep them in pure water contained in said pure water tanks, a second wafer container for containing as many wafers as said first wafer container to steep the wafers in the etchant in said etchant tank, this method comprising the steps of: automatically transferring said wafers from said first wafer container to said second wafer container within pure water contained in one of said pure water tanks, having said second wafer container steeped in the etchant contained in said etchant tank, and transferring said wafer from said second wafer container to said first wafer container within pure water contained in one of said pure water tanks.

7. The method as claimed in claim 6 wherein said first wafer container is a wafer basket and said second wafer container is a wafer drum, said method comprising the steps of causing said wafer basket containing wafers to approach said wafer drum in a manner such that the opening of said wafer basket enters the opening of the wafer drum; turning said wafer drum together with said wafer basket to thereby cause the wafers to roll into said wafer drum due to gravitation.

* * * * *